United States Patent [19]
Suizu

[11] Patent Number: 5,279,973
[45] Date of Patent: Jan. 18, 1994

[54] RAPID THERMAL ANNEALING FOR SEMICONDUCTOR SUBSTRATE BY USING INCOHERENT LIGHT

[75] Inventor: Yasumasa Suizu, Tokyo, Japan

[73] Assignee: Kabushiki Kaisha Toshiba, Kawasaki, Japan

[21] Appl. No.: 775,837

[22] Filed: Oct. 15, 1991

[30] Foreign Application Priority Data

Oct. 16, 1990 [JP] Japan ................. 2-277101

[51] Int. Cl.[5] .......................................... H01L 21/477
[52] U.S. Cl. ......................................... 437/25; 437/174; 437/247; 437/942
[58] Field of Search .................... 437/942, 247, 174, 25

[56] References Cited

U.S. PATENT DOCUMENTS

| | | | |
|---|---|---|---|
| 4,331,485 | 5/1982 | Gat | 437/174 |
| 4,350,537 | 9/1982 | Young et al. | 437/174 |
| 4,482,395 | 11/1984 | Hiramoto | 437/174 |
| 4,576,652 | 3/1986 | Hovel et al. | 427/53.1 |
| 4,698,486 | 10/1987 | Sheets | 437/247 |
| 4,784,975 | 11/1988 | Hofmann et al. | 437/247 |
| 4,851,358 | 7/1989 | Huber | 437/174 |
| 4,868,133 | 9/1989 | Huber | 437/174 |
| 4,981,815 | 1/1991 | Kakoschke | 437/174 |
| 5,017,508 | 5/1991 | Dodt et al. | 437/942 |

FOREIGN PATENT DOCUMENTS

| | | | |
|---|---|---|---|
| 56-100451 | 8/1981 | Japan | 437/174 |
| 58-190020 | 11/1983 | Japan | 437/174 |
| 61-063019 | 4/1986 | Japan . | |
| 61-260625 | 11/1986 | Japan | 437/174 |
| 62-008519 | 1/1987 | Japan | 437/942 |
| 62-088328 | 4/1987 | Japan | 437/942 |
| 1-235232 | 9/1989 | Japan | 437/174 |
| 2-33934 | 2/1990 | Japan | 437/174 |
| 2070327 | 9/1981 | United Kingdom | 437/942 |
| 2179787 | 3/1987 | United Kingdom | 437/174 |

OTHER PUBLICATIONS

Wolf et al., "Silicon processing for the VLSI Era, vol. I: Process technology", Lattice Press, 1986 pages.

Primary Examiner—Robert Kunemund
Assistant Examiner—Ourmazd S. Ojan
Attorney, Agent, or Firm—Finnegan, Henderson, Farabow, Garrett & Dunner

[57] ABSTRACT

Rapid thermal annealing for heat-treating a semiconductor substrate is provided without damaging the substrate surface After the semiconductor substrate is placed in an annealing apparatus having an incoherent light source, an inert gas containing a very small amount of an oxygen gas is introduced into the annealing apparatus, while applying an incoherent light to the substrate surface from the incoherent light source. In this case, the oxygen concentration in the inert gas is defined by 10 to 1000 ppm.

5 Claims, 3 Drawing Sheets

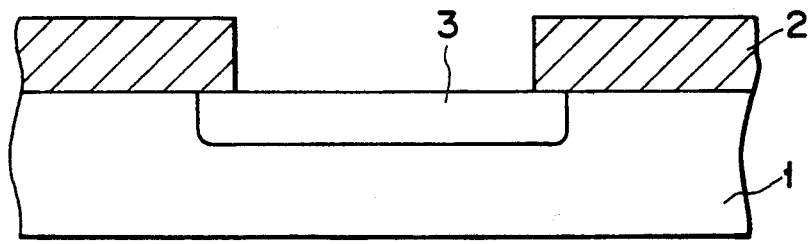
F I G. 1A
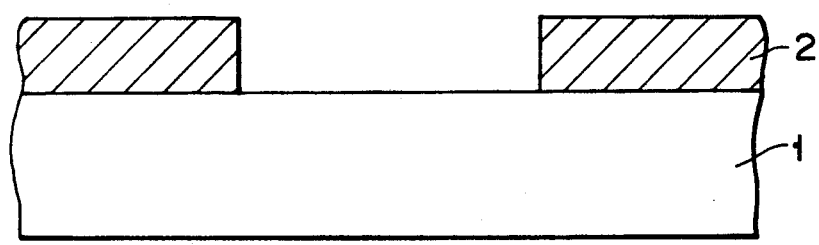
F I G. 1B

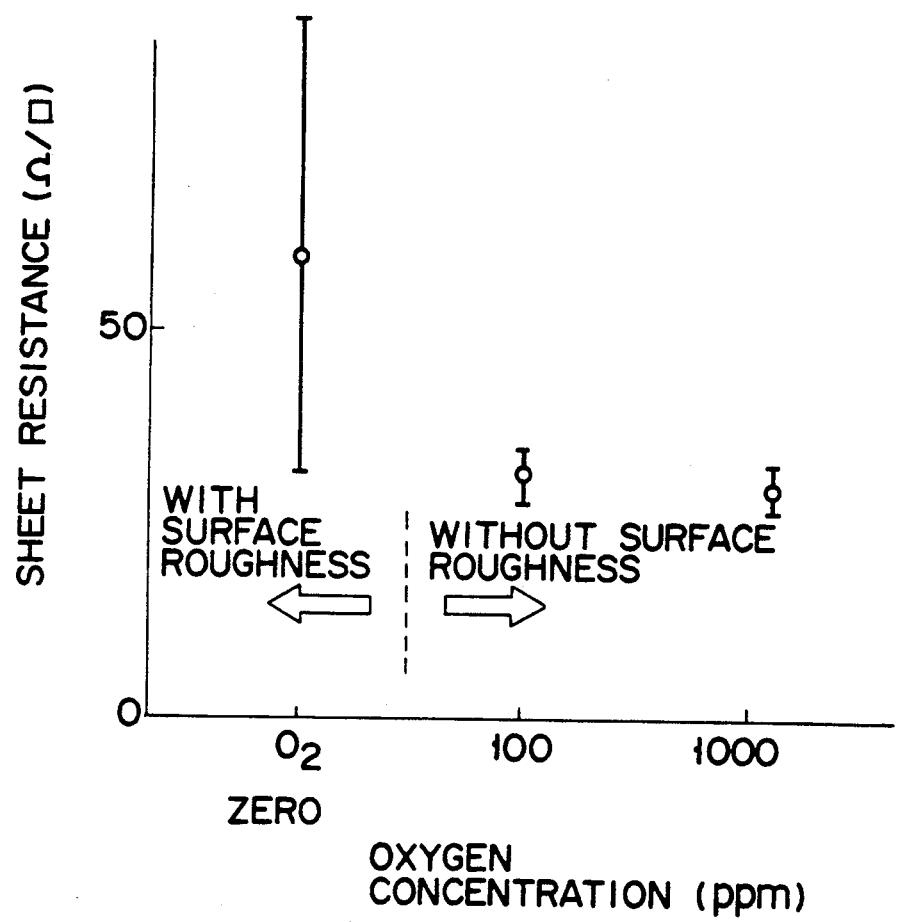
F I G. 4

RAPID THERMAL ANNEALING FOR SEMICONDUCTOR SUBSTRATE BY USING INCOHERENT LIGHT

BACKGROUND OF THE INVENTION

1. Field of the Invention

This invention relates to a method of making a semiconductor device, and more particularly to rapid thermal annealing of a semiconductor substrate by radiation of incoherent light.

2. Description of the Related Art

In a manufacturing process of a semiconductor device, rapid thermal annealing (hereinafter, referred to as RTA) of a semiconductor substrate has been used. The advantages of RTA lie in: first, since rapid heating and cooling are performed, it is possible to heat-treat a semiconductor substrate for a short time with an accuracy of second unit; and second, since semiconductor substrate is transferred to and from a heating furnace at a low temperature near the room temperature, an atmosphere of the heating furnace is accurately controlled during heating. In the heat-treatment of semiconductor substrates using an ordinary electric furnace, outside air enters into the furnace due to entrainment with transfer of the semiconductor substrate into the furnace. Accordingly, a problem of oxidizing the substrate may often occur, which should not occur. RTA is especially effective to avoid this problem, because RTA enables the heat-treatment in the inert gas atmosphere under the condition of the residual oxygen concentration being as low as almost zero. Conventionally, in the heat-treatment by RTA, a low concentration of residual oxygen has been considered as an advantage in controlling the atmosphere.

The application of RTA includes the activation of ion implantation layers, the elimination of crystal defects in the diffused layers, and the formation of resistor layers with low resistance by heat-treating a semiconductor substrate, having a region containing a high concentration impurity, in an atmosphere of inert gas such as nitrogen. In such applications, it is possible to heat-treat the semiconductor substrate without oxidation.

In the actual manufacturing process semiconductor devices, however, a problem arises in heating an exposed substrate. Particularly, when a semiconductor region having an impurity concentration of $1.0 \times 10^{19}$ cm$^{-3}$ or more and formed in a semiconductor substrate is heat-treated by RTA in a nitrogen atmosphere, impurity atoms and atoms constituting the substrate will be removed from the surface of the exposed semiconductor region. This results in a nonuniform sheet resistance of the semiconductor region after the heat-treatment by RTA, which makes it difficult to form a low resistance element in the semiconductor substrate. The nonuniformity of the sheet resistance results inevitably from heat-treatment of an exposed substrate, but not from variation in the temperature of heat-treatment. Additionally, in a nitrogen atmosphere, heat-treatment at as high as 1100° C. or more will create surface roughness in the substrate regardless of impurity concentration. Such nonuniformity of the sheet resistance and surface roughness (hereinafter, generically referred to as damage to the substrate surface) have an undesirable effect on the uniformity and reproducibility in the manufacturing process of semiconductor devices.

SUMMARY OF THE INVENTION

Accordingly, an object of the present invention is to provide a method of heat-treating a semiconductor substrate whose major surface is partially exposed, using RTA.

Another object of the present invention is to provide a method of making a semiconductor device having a uniform sheet resistance by heat-treating of a high-impurity concentration semiconductor region exposed to a semiconductor substrate surface, using RTA.

Still another object of the present invention is to provide a method of making a semiconductor device for activating an ion implanted layer and removing crystal defects in a diffused layer and a semiconductor substrate, using RTA.

A further object of the present invention is to provide a method of heat-treating a semiconductor substrate without damaging a surface of the semiconductor substrate, using RTA.

According to an aspect of the present invention, there is provided a method of making a semiconductor device, which comprises placing a semiconductor substrate in an annealing apparatus having an incoherent light source, and introducing an inert gas containing a very small amount of an oxygen gas into the annealing apparatus, while applying an incoherent light to the major surface of the semiconductor substrate from the incoherent light source, thereby subjecting the semiconductor substrate to rapid thermal annealing. In this case, the oxygen concentration in the inert gas is defined by 10 to 1000 ppm.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIGS. 1A and 1B are sectional views showing a semiconductor substrate to be heat-treated whose major surface is partially exposed;

FIG. 4 is a diagram indicating the presence or absence of damage to a semiconductor substrate surface, using oxygen concentration as a parameter.

DETAILED DESCRIPTION OF THE PREFERRED EMBODIMENTS

Figure 2:
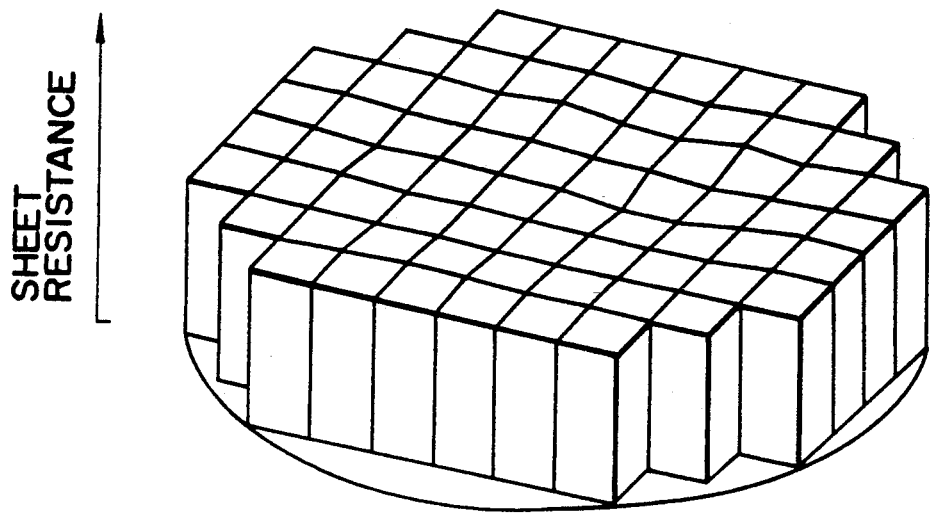
FIG. 2 illustrates a distribution of sheet resistance at a surface of a semiconductor substrate subjected to RTA in an inert gas containing a very small amount of oxygen.

An embodiment of the present invention will be explained in detail.

From the distribution profile, damage to the substrate surface described in the prior art has been considered to stem basically from the same phenomenon. Specifically, the direct cause is that a dopant impurity in the substrate, such as arsenic (As) atoms, or silicon (Si) atoms, themselves are removed from the surface. It has been considered that the primary cause of such removal of atoms is the fact that a barrier to the removed of atoms from the surface is lost because a so-called natural oxide film, which normally exists on the surface of the semiconductor substrate located in the atmosphere, is lost due to heating in an inert gas atmosphere. It has been known that such a phenomenon takes place when the oxygen concentration in the inert gas atmosphere is approximately 1 ppm or less at a heat-treatment temperature of approximately 1000° C., typical conditions for use of RTA. The phenomenon which occurs will be explained in detail. In a sufficiently low concentration of oxygen, a normal thermal oxidation takes place as follows:

$$Si + O_2 \rightarrow SiO_2$$

Instead of this reaction, however, the following reaction is predominant in determining an equilibrium state:

$$SiO_2 \rightarrow SiO + \tfrac{1}{2}O_2$$

As a result of this, SiO whose vapor pressure is relatively high vaporizes easily, and is removed from the substrate surface.

It can be apparent that RTA provides more accurate control of atmosphere than the heat-treatment by normal electric furnace, but on the other hand, it permits the above-described phenomenon to take place.

To avoid this problem, in the present invention, when a semiconductor substrate whose major surface is partially exposed is heat-treated by TRA in an atmosphere of inert gas such as nitrogen, a very small amount of oxygen is purposely added to the inert gas atmosphere. A suitable oxygen concentration required for the present invention must meet the following two conditions:

First condition—the oxygen concentration must be high enough to allow the oxide film (including natural oxide film) on the substrate surface to remain stably.

Second condition—the oxygen concentration must be low enough to prevent the oxide film from growing on the substrate surface to a thickness more than necessary.

Of these two conditions, an oxygen concentration that meets the first condition must be approximately 1 ppm or more as mentioned above, and when taking into account different variations caused in the process, it is desirable that the concentration should be approximately 10 ppm or more. On the other hand, for an oxygen concentration that fulfills the second condition, this condition must be defined more specifically.

That is, the new second condition is that the thickness of an oxide film grown on the substrate must be approximately 50 Å or less in spite of the substrate condition including impurity concentration when a heat-treatment is carried out at 900°–1200° C. for about 60 seconds or less that is a typical condition of RTA. Experiment has shown that an oxygen concentration fulfilling the new second condition is approximately 1000 ppm or less.

It is not desirable to expect the residual oxygen from the outside air to achieve an oxygen concentration that meets the above two conditions, because such residual oxygen is not controllable and the inert gas atmosphere is contaminated. For obtaining a controlled oxygen concentration that meets the two conditions, it is preferable to employ a mass flow controller (hereinafter, referred to as an MFC). Since a normal flow rate of process gas used in RTA is approximately 10 slm, the condition of 1000 ppm or less can be satisfied provided that the flow rate of oxygen gas is 10 sccm or less. The flow rate accurately controlled by MFC is 1 sccm or more, so that it is sufficiently possible to achieve the oxygen concentration that meets the two conditions by using an MFC.

Therefore, only minor change to the conventional RTA apparatus makes it possible to heat-treating the exposed substrate surface in an inert gas atmosphere without the unwanted damages of the substrate surface.

FIGS. 1A and 1B show a semiconductor substrate to be heat-treated, whose major surface is partially exposed.

In FIG. 1A, a P-type semiconductor substrate 1 has an N+-type ion implanted layer 3 (or diffused layer) with an impurity (As) concentration of $1.0 \times 10^{19}$ cm$^{-3}$ or more, the N+-type ion implanted layer 3 being exposed through an opening formed in a silicon oxide film 2.

In FIG. 1B, part of the surface of the P-type semiconductor substrate 1 is similarly exposed through an opening formed in the silicon oxide film 2.

To heat the exposed surface of the N+-type ion implanted layer 3 of FIG. 1A by radiation of incoherent light, after the P-type semiconductor substrate 1 is placed in an RTA apparatus, an inert gas (nitrogen gas) is introduced into the RTA apparatus. The oxygen concentration in the inert gas atmosphere is controlled to approximately 100 ppm to accomplish a heat-treatment at 1000° C. for 60 seconds. FIG. 2 shows the distribution of the sheet resistance of the N+-type ion implanted layer 3 after the heat-treatment.

Figure 3:
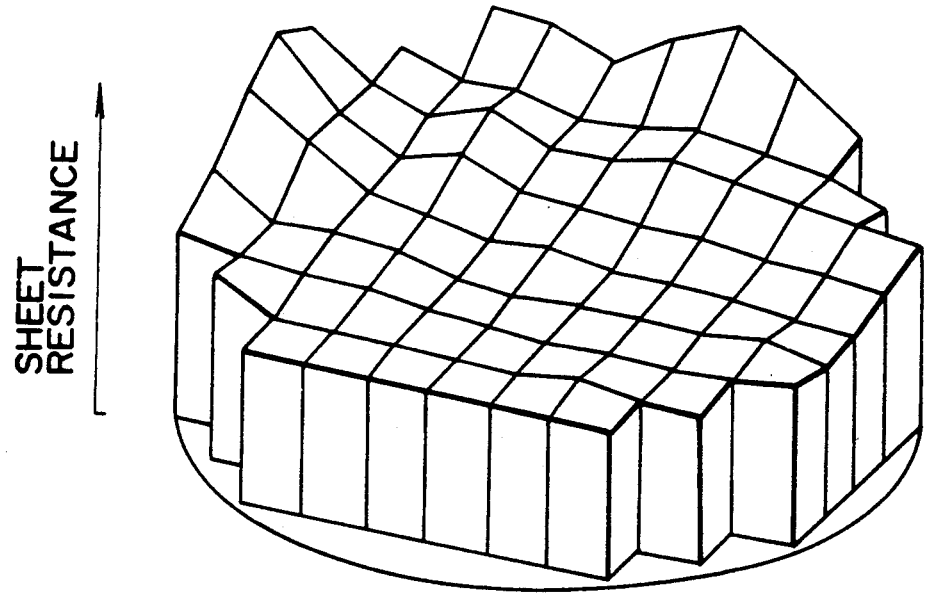
FIG. 3 shows a distribution of sheet resistance at a surface of a semiconductor substrate subjected to RTA in an inert gas practically free from oxygen.

On the other hand, the P-type semiconductor substrate 1 of FIG. 1A is placed in the RTA apparatus and then heat-treated at 1000° C. for 60 seconds in an inert gas (nitrogen gas) atmosphere free from oxygen. FIG. 3 illustrates the distribution of the sheet resistance of the N+-type ion implanted layer 3 after such a heat-treatment.

As seen from FIGS. 2 and 3, variation in the sheet resistance of the N+-type ion implanted layer 3 is significantly improved by adding a very small amount of oxygen to the inert gas, which shows the prominent effect of controlling the oxygen concentration.

To heat the exposed surface of the P-type semiconductor substrate of FIG. 1B by incoherent radiation, after the P-type semiconductor substrate 1 is placed in the RTA apparatus, an inert gas (nitrogen gas) containing approximately 100 ppm of oxygen is introduced into the RTA apparatus, thereby performing a heat-treatment at 1000° C. for 60 seconds.

On the other hand, when the same substrate 1 is heat-treated in an inert gas (nitrogen gas) atmosphere free from oxygen under the same condition as describe above, undesirable surface roughness occurs at the exposed surface.

As described above, the nonuniformity of the sheet resistance results from the heat-treatment of the exposed substrate surface, but not from variation in the temperature of heat-treatment. In the nitrogen atmosphere, the heat-treatment at the temperature higher than 1100° C. may create noticeable roughness of the substrate surface. In either case, such nonuniformity of the sheet resistance and surface roughness have an undesirable effect on the uniformity and reproducibility in the manufacturing process of semiconductor devices. The disadvantage, however, can be overcome by adding a very small amount of oxygen to the inert gas.

FIG. 4 is a comprehensive illustration of the existence of damage to the substrate surface, using the oxygen concentration as a parameter. Here, 100 ppm and 1000 ppm of oxygen concentration respectively indicate that the oxygen concentration flow rate is controlled to 1 sccm and 10 sccm by the MFC at the inert gas (e.g., nitrogen gas or argon gas) flow rate of 10 slm. Zero oxygen concentration means that there is no control of oxygen concentration (this may be considered as similar to the prior art). That is, it is a case where an exact oxygen concentration is unknown, but may be considered at least 1 ppm or less.

To prevent the damage of the substrate surface effectively by purposely adding a very small amount of oxygen to the inert gas atmosphere, the most effective oxygen concentration to be added is in the range more than 10 ppm and less than 1000 ppm. The thickness of the oxide film formed on the substrate under the above heat-treatment condition is in the range of measurement errors and almost the same as that before the heat-treatment. As a result, the requirement is sufficiently satisfied in that extra oxide film is prevented from growing.

As described above, according to the method of making the semiconductor device of the present invention, the following advantages will be provided.

When a semiconductor substrate having an exposed surface is heat-treated by RTA, a very small amount of oxygen gas is purposely added to an inert gas atmosphere. This makes it possible to carry out RTA to the extent that an oxide film is stably remained on the substrate surface and also to the extent that an excessively thick oxide film is prevented from growing on the substrate surface. As a consequence, it is possible to perform RTA without causing damage to the substrate surface, which provides a good uniformity and reproducibility in the manufacturing process of semiconductor devices.

It is further understood by those skilled in the art that the foregoing description is the preferred embodiment and that various changes and modifications may be made in the invention without departing from the spirit and scope thereof.

What is claimed is

1. A method of making a semiconductor device comprising the steps of:
   preparing a semiconductor substrate having an oxide film and an exposed substrate surface on one side of the substrate;
   placing said semiconductor substrate in an annealing apparatus closed from the atmosphere and having an incoherent light source; and
   subjecting said semiconductor substrate to rapid thermal annealing by applying incoherent light to said one side of the semiconductor substrate while maintaining in the annealing apparatus an annealing atmosphere consisting essentially of inert gas and oxygen gas to prevent removal of atoms from the exposed substrate surface, the amount of oxygen gas in the annealing atmosphere being at least sufficient to maintain the oxide film on the one side of the semiconductor substrate and less than an amount that would cause the oxide film to grow.

2. The method according to claim 1, wherein the amount of oxygen gas in the annealing atmosphere is in the range of from 10 to 1000 ppm.

3. The method according to claim 1, wherein the inert gas is selected from the group consisting essentially of nitrogen gas, argon gas and a mixture of nitrogen and argon gases.

4. The method according to claim 1, wherein the substrate surface includes a semiconductor region having a conductivity type opposite to that of said semiconductor substrate.

5. The method according to claim 4, wherein said semiconductor region is an ion implanted region.

* * * * *